(12) United States Patent
Takahashi et al.

(10) Patent No.: US 10,032,804 B2
(45) Date of Patent: Jul. 24, 2018

(54) ELECTRO-OPTIC APPARATUS AND ELECTRONIC DEVICE

(71) Applicant: SEIKO EPSON CORPORATION, Tokyo (JP)

(72) Inventors: Nariya Takahashi, Chino (JP); Hiroyuki Hosaka, Matsumoto (JP); Suguru Uchiyama, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/640,950

(22) Filed: Jul. 3, 2017

(65) Prior Publication Data

US 2018/0031937 A1 Feb. 1, 2018

(30) Foreign Application Priority Data

Jul. 26, 2016 (JP) .................................. 2016-146023

(51) Int. Cl.
*H01L 27/12* (2006.01)
*G02F 1/1362* (2006.01)
*G02F 1/1345* (2006.01)

(52) U.S. Cl.
CPC .......... *H01L 27/124* (2013.01); *G02F 1/1345* (2013.01); *G02F 1/136286* (2013.01); *G09G 2300/043* (2013.01); *G09G 2300/0426* (2013.01); *G09G 2320/0223* (2013.01)

(58) Field of Classification Search
CPC ..... G09G 2300/0426; G09G 2300/043; G09G 2320/0223; G09G 2320/0233; H01L 27/3279
See application file for complete search history.

(56) References Cited

U.S. PATENT DOCUMENTS 5,610,414 A * 3/1997 Yoneda ................ G09G 3/3611
257/203

FOREIGN PATENT DOCUMENTS

JP 2015-106109 A 6/2015

* cited by examiner

*Primary Examiner* — Julio J Maldonado
*Assistant Examiner* — Evan Clinton
(74) *Attorney, Agent, or Firm* — Oliff PLC

(57) ABSTRACT

An electro-optic apparatus includes an element substrate, a pixel region including a first and second pixel formed on the element substrate, a first terminal formed on the element substrate, a second terminal formed on the element substrate, located opposite of the pixel region with the first terminal being interposed between the pixel region and the second terminal, a first wiring extending from the first terminal included in a path for transmitting to the first pixel, a first signal having been input to the first terminal and a second wiring extending from the second terminal included in a path for transmitting to the second pixel, a second signal having been input to the second terminal. Further, a difference between a resistance of the path for transmitting the first and second signal is made smaller than a resistance difference due to a difference between a length of the first and second wiring.

12 Claims, 9 Drawing Sheets

ELECTRO-OPTIC APPARATUS AND ELECTRONIC DEVICE

BACKGROUND

1. Technical Field

The present invention relates to an electro-optic apparatus and an electronic device.

2. Related Art

In electro-optic panels, such as a liquid crystal panel, with the increase of the number of pixels of such an electro-optic panel, the number of terminals to be mounted has been significantly increased. In JP-A-2015-106109, as one of methods for increasing the number of terminals, there is disclosed a method that allows terminals to be mounted across a plurality of rows along one side of a display region. Further, in JP-A-2015-106109, there is disclosed a method that, in order to reduce the unevenness of display due to the variations among the capacitance elements of individual wirings coupled to the terminals, which are mounted across a plurality of rows, allows the disposition of a wiring that is different from wirings for transmitting signals and that extends from each of the terminals in a direction opposite the display region.

In a technology disclosed in JP-A-2015-106109, there are differences among distances from a pixel region to terminals belonging to mutually different rows among the plurality of rows, and thus, the length of a wiring extending from a terminal differs in accordance with which of the plurality of rows the terminal belongs to. This configuration is likely to become a cause of the degradation of the quality of displayed images. Particularly, when further downsizing and higher resolution of the electro-optic apparatus are intended and/or the use of a plurality of driving circuits is intended, the display quality is likely to be degraded.

SUMMARY

An advantage of some aspects of the invention is that a technology is provided that reduces the degradation of display quality due to the differences among the lengths of wirings each extending from a corresponding one of a plurality of terminals.

According to a first aspect of the invention, an electro-optic apparatus includes an element substrate, a pixel region including a first pixel and a second pixel and formed on the element substrate, a first terminal formed on the element substrate, a second terminal formed on the element substrate and located at a side opposite the pixel region with the first terminal being interposed between the pixel region and the second terminal, a first wiring extending from the first terminal and included in a path for transmitting, to the first pixel, a first signal having been input to the first terminal, and a second wiring extending from the second terminal and included in a path for transmitting, to the second pixel, a second signal having been input to the second terminal. Further, a difference between a resistance of the path for transmitting the first signal and a resistance of the path for transmitting the second signal is made smaller than a resistance difference due to a difference between a length of the first wiring and a length of the second wiring.

In the above electro-optic apparatus according to the first aspect of the invention, the difference between the resistance of the path for transmitting the first signal to the first pixel and the resistance of the path for transmitting the second signal to the second pixel is made smaller than a resistance difference due to the difference between the length of the first wiring and the length of the second wiring. Thus, this configuration reduces the degradation of display quality due to the differences among the lengths of wirings each extending from a corresponding one of a plurality of terminals.

In the first aspect of the invention, a first configuration in which the width of the second wiring is larger than the width of the first wiring may be employed.

With this first configuration in the first aspect of the invention, the degradation of display quality is reduced by setting the line widths of the first wiring and the second wiring.

In the first aspect of the invention, a second configuration in which the width of the second terminal is larger than the width of the first terminal may be employed.

With this second configuration in the first aspect of the invention, the degradation of display quality is reduced by setting the widths of the first terminal and the second terminal.

In the first aspect of the invention, in the above first configuration or the above second configuration, a third configuration in which a third wiring extends from the first terminal, a fourth wiring extends from the second terminal, and the width of the third wiring is larger than the width of the fourth wiring may be employed.

With this third configuration in the first aspect of the invention, the degradation of display quality is reduced by reducing the increase of the variations among the capacitances of the wirings due to the setting of the line widths of the wirings or the setting of the widths of the terminals, these settings being made to reduce the degradation of display quality.

In addition to the above electro-optic apparatus, an electronic device according to a second aspect of the invention is also ideated.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
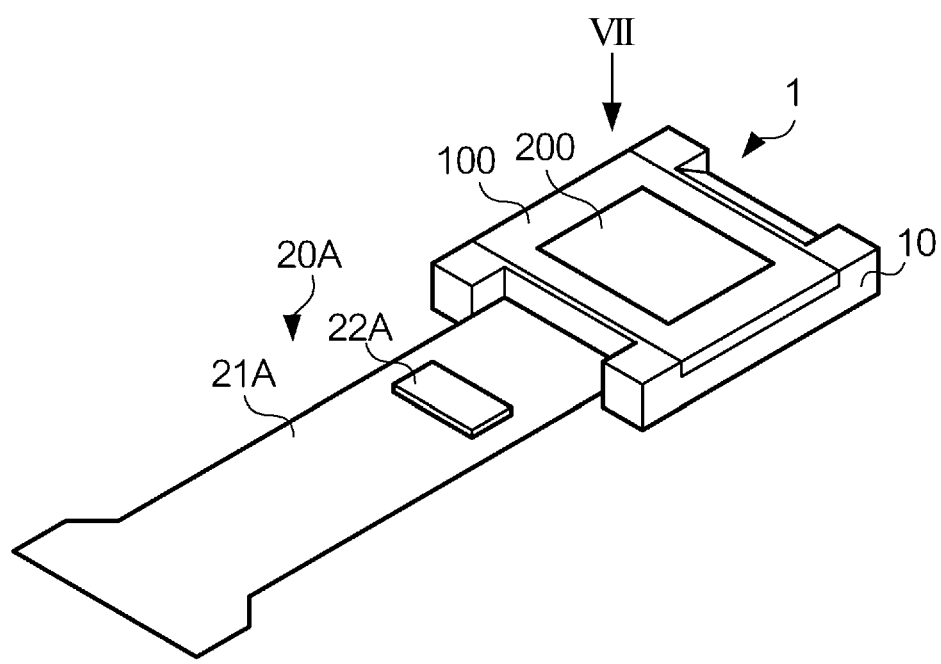
FIG. 1 is a perspective view of an electro-optic apparatus according to a first embodiment of the invention illustrating a configuration of the electro-optic apparatus.

Hereinafter, embodiments of the invention will be described referring to the drawings. In individual figures to be referred to in the following description, there are cases where, in order to cause the sizes of individual members, individual regions, and any other elements to be recognizable, the reduction scales thereof are caused to be different from the actual scales thereof. Further, in embodiments described below, "coupling" is a concept involving electric coupling.

First Embodiment

FIG. 1 is a perspective view of an electro-optic apparatus 1, an electro-optic apparatus according to a first embodiment of the invention.

In this first embodiment, the electro-optic apparatus 1 is a liquid crystal apparatus. The electro-optic apparatus 1 includes a liquid crystal panel 100. The liquid crystal panel 100 is one example of an electro-optic panel that performs electro-optic operation, and is a transmissive liquid crystal apparatus in this first embodiment. The electro-optic operation includes display operation for displaying images on a pixel region 200 of the liquid crystal panel 100.

The electro-optic apparatus 1 includes a wiring substrate 20A and a case 10. The case 10 has a frame shape and includes an opening in a portion corresponding to a display portion of the liquid crystal panel 100. The liquid crystal panel 100 is contained in the case 10, and one end of the wiring substrate 20A is bonded to the liquid crystal panel 100.

In this first embodiment, the wiring substrate 20A is a chip-on film (COF). The wiring substrate 20A includes a flexible print circuit (FPC) 21A and a driving circuit 22A. This driving circuit 22A is disposed on the FPC 21A. The FPC 21A includes a base substrate having an insulation property, such as a polyimide substrate, and wirings on the base substrate that have been formed through a patterning process. The driving circuit 22A outputs various signals for displaying images on the liquid crystal panel 100. The driving circuit 22A is mounted on the FPC 21A, and one end of the FPC 21A (the wiring substrate 20A) is coupled to the liquid crystal panel 100, whereas the other end of the FPC 21A is coupled to upper-layer circuits (not illustrated).

Figure 2:
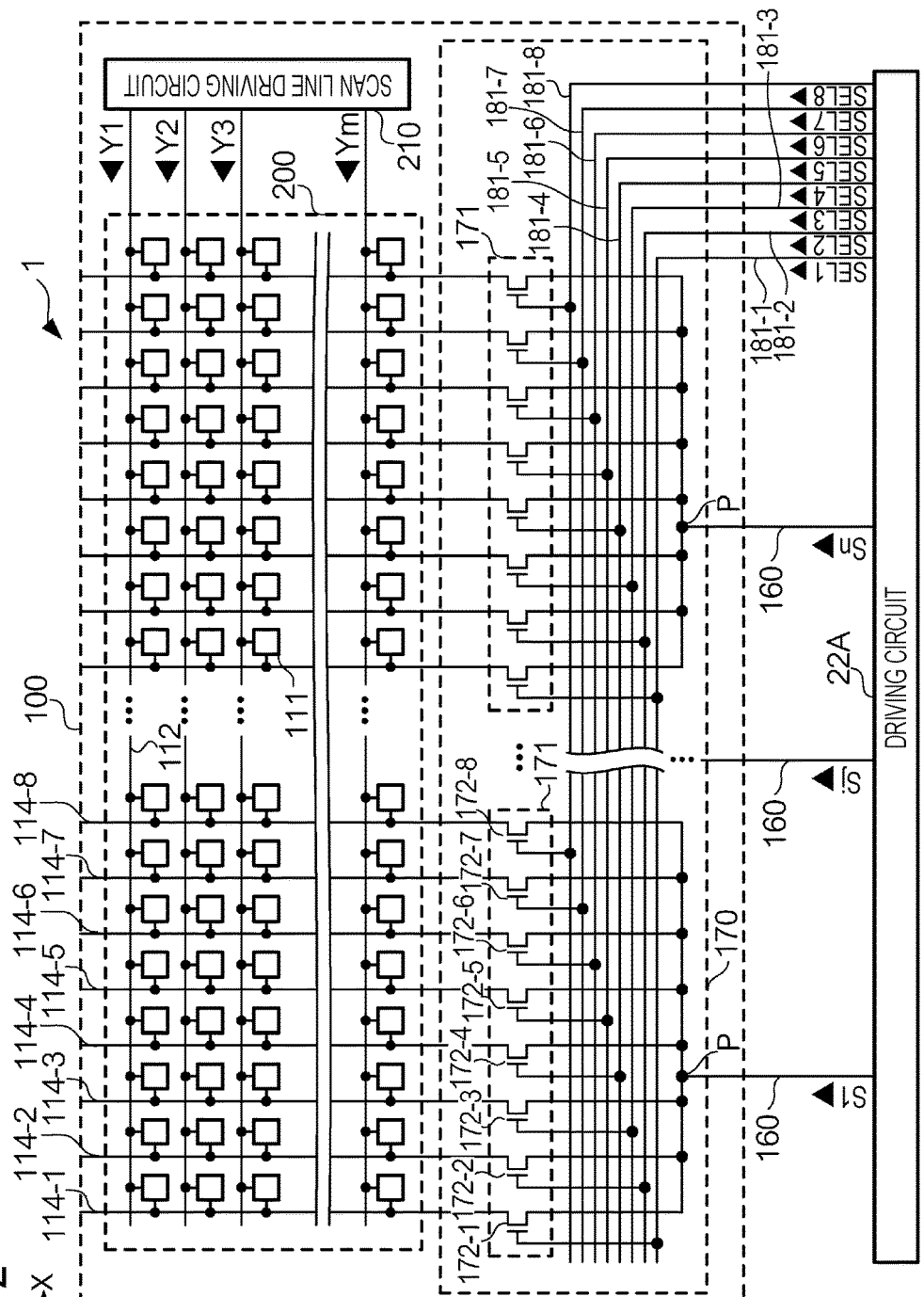
FIG. 2 is a block diagram illustrating an electric configuration of the electro-optic apparatus according to the first embodiment.

FIG. 2 is a block diagram illustrating an electric configuration of the electro-optic apparatus 1.

The liquid crystal panel 100 includes the pixel region 200, a scan line driving circuit 210, and a data line selection circuit 170. The data line selection circuit 170 includes n video signal lines 160, a plurality of demultiplexers 171, and k selection signals (control signal lines). Each of n and k is a natural number. In this first embodiment, k is equal to "8". That is, the data line selection circuit 170 includes eight selection signal lines 181-1 to 181-8. The data line drive selection circuit 170 and the driving circuit 22A constitute a data line driving circuit.

The pixel region 200 includes a plurality of pixels 111, and is a region for displaying images. The pixel region 200 includes scan lines 112, data lines 114, and pixels 111. The number of the scan lines 112 is m. The number of the data lines 114 is (k×n). The number of the pixels 111 is (m×k×n). Here, m is a natural number. The scan lines 112 are signal lines for transmitting scan signals, and are constituted by a plurality of scan lines extending along a row direction (an X-direction) that is a first direction. The data lines 114 are signal lines for transmitting data signals, and are constituted by a plurality of signal lines extending along a column direction (a Y-direction) that is a second direction. Any one of the scan lines 112 and any one of the data lines 114 are electrically isolated with each other. Each of the pixels 111 is disposed so as to be associated with a corresponding intersection of one of the scan lines 112 and one of the data lines 114. The (k×n) data lines 114 are sectioned into n columns of data line groups (data line blocks). One data line group is constituted by k data lines 114-1 to 114-k. In this first embodiment, since k is equal to eight, eight data lines 114-1 to 114-8 are consecutively arranged in the X-direction so as to constitute one block (in this regard, however, the eight data lines 114-1 to 114-8 are not necessarily consecutively arranged in the X-direction). Each of the plurality of demultiplexers 171 is disposed so as to be associated with a corresponding one of the data line groups. That is, the pixels 111 are arrayed in a matrix shape of m rows and (k×n) columns. Further, in the X-direction, (k×m) consecutive pixels 111 constitute one pixel group (one pixel block) so as to correspond to the k data lines 114 (in this regard, however, the (k×m) pixels 111 are not necessarily consecutive in the X-direction). In this first embodiment, k is equal to eight, and eight consecutive pixels 111 in the X-direction constitute one block across m rows. The liquid crystal panel 100 includes n columns of pixel groups. The detail of the pixel 111 will be described later. When, in the following description, there is a need for distinguishing each of the plurality of scan lines 112, the scan lines 112 will be represented by a 1st row scan line 112, a 2nd row scan line 112, a 3rd row scan line 112, ..., and an m-th row scan line 112.

The scan line driving circuit 210 outputs a scan signal for selecting one scan line 112 from among the plurality of scan lines 112. The scan line driving circuit 210 respectively supplies the 1st row scan line 112, the 2nd row scan line 112, the 3rd row scan line 112, ..., and the m-th row scan line 112 with a scan signal Y1, a scan signal Y2, a scan signal Y3, ..., and a scan signal Ym. The scan signals Y1, Y2, Y3, ..., and Ym are signals that sequentially and exclusively become high (H) level.

The selection signal lines (control signal lines) 181-1 to 181-8 are signal lines for transmitting selection signals (control signals) SEL1 to SELk supplied from the driving circuit 22A. Specifically, a selection signal line 181-$i$ ($i$ being a natural number that satisfies a condition: 1≤$i$≤k) transmits a selection signal SEL$i$. The selection signals SEL1 to SEL8 are signals that sequentially and exclusively become H level.

The data line selection circuit 170 is a circuit that selects, for each of the pixel groups, one data line 114 from among the k data lines 114. Each of the demultiplexers 171, included in the data line selection circuit 170, is disposed so as to be associated with a corresponding one of the n columns of pixel groups, and includes TFTs 172-1 to 172-8. Here, the TFTs 172-1 to 172-8 are n-channel type field-effect transistors. The TFTs 172-1 to 172-8 are switching elements for selecting one data line 114, and include their respective gate electrodes to each of which a corresponding one of the selection signals SEL1 to SEL8 for selecting the one data line 114 is input. Moreover, one end of each of the TFTs 172-1 to 172-8, that is, its drain electrode, is coupled to one data line 114, and the other end of the each of the TFTs 172-1 to 172-8, that is, its source electrode, is coupled to the driving circuit 22A via one of the video signal lines 160. The video signals 160 are signal lines each for transmitting a corresponding one of data signals (source signals) S input from the driving circuit 22A to the data line selection circuit 170, and are constituted by n signal lines coupled to the data line selection circuit 170. Further, a j-th column video signal line 160 (a j-th video signal line 160) is branched into eight signal lines at a node P (a branch node), and is coupled to the source electrodes of the TFTs 172-1 to 172-8. Here, j is a natural number that satisfies a condition: $1 \leq j \leq n$. The data signals S are signals for driving the pixels 111. Specifically, the data signals S are signals representing pieces of data to be written into the pixels 111. The source electrodes of the TFTs 172-1 to 172-8 are supplied with the same data signal S. The TFTs 172-1 to 172-8 select, in accordance with the selection signals SEL1 to SEL8, one data line 114 from among k data lines 114 coupled to a pixel group corresponding to the relevant TFTs 172-1 to 172-8. Specifically, when the gate electrode of any one of the TFTs 172-1 to 172-8 has been supplied with a selection signal SELi of L level, the any one of the TFTs 172-1 to 172-8 is brought into OFF state, and as a result, the coupling of the driving circuit 22A to one of the data lines 114 that is coupled to the any one of the TFTs 172-1 to 172-8 is cut off. In contrast, when the gate electrode of any one of the TFTs 172-1 to 172-8 has been supplied with a selection signal SELi of H level, the any one of the TFTs 172-1 to 172-8 is brought into ON state, and as a result, the driving circuit 22A is coupled to one of the data lines 114 that is coupled to the any one of the TFTs 172-1 to 172-8.

During a period when one of the scan data lines 112 is selected, the driving circuit 22A outputs data signals S1, S2, S3, . . . , and Sn on the respective 1st, 2nd, 3rd, . . . , and n-th columns of the video signal lines 160 and further the driving circuit 22A outputs the selection signals SEL1 to SEL8 on the respective selection signals 181-1 to 181-8. For each of the n pixel groups, one of the data lines 114 is supplied with one of the data signals in accordance with the selection signals SEL1 to SEL8.

Figure 3:
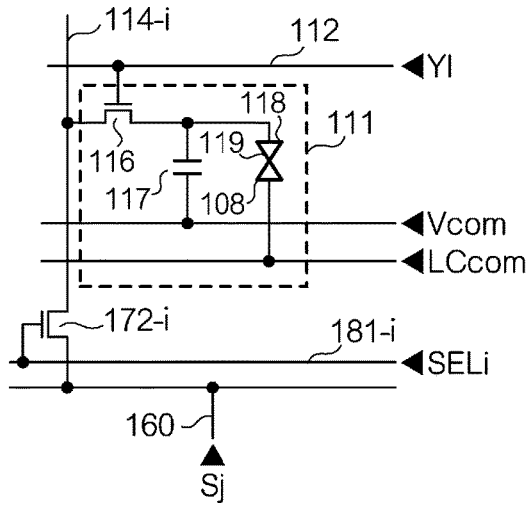
FIG. 3 is a diagram illustrating an equivalent circuit of a pixel according to the first embodiment.

FIG. 3 is a diagram illustrating an equivalent circuit of the pixel 111. The pixel 111 includes a pixel TFT 116, a pixel electrode 118, a liquid crystal layer 119, a common electrode 108, and a storage capacitor 117. The pixel TFT 116 is a switching element for controlling writing data into (supplying a voltage to) the pixel electrode 118, and here is an n-channel type field-effect transistor. The gate electrode of the pixel TFT 116 is coupled to a corresponding scan line 112, the source electrode thereof is coupled to a data line 114-*i*, and the drain electrode thereof is coupled to the pixel electrode 118. Upon supply of a scan signal Y1 of H level to the scan line 112, (1 being a natural number that satisfies a condition: $1 \leq l \leq m$), the pixel TFT 116 enters ON state, and as a result, the data line 114-*i* and the pixel electrode 118 are brought into a state of being electrically coupled to each other. That is, data is written into the pixel electrode 118. Upon supply of the scan signal Y1 of L level to the scan line 112, the pixel TFT 116 enters OFF state, and as a result, the data line 114-*i* and the pixel electrode 118 are brought into a state of being electrically uncoupled to each other. The common electrode 108 is common to all of the pixels 111. The common electrode 108 is supplied with a common voltage LCcom by, for example, the driving circuit 22A. The liquid crystal layer 119 is supplied with a voltage corresponding to the difference between the electric potentials of the pixel electrode 118 and the common electrode 108, and this voltage causes the optical characteristic (reflectance or transmittance) of the pixel 111 to vary. The storage capacitor 117 is parallel coupled to the liquid crystal layer 119, and retains electric charges corresponding to the difference between the electric potentials of the pixel electrode 118 and a common voltage Vcom (here, Vcom=LCcom).

The gate electrode of a TFT 172-*i* is coupled to a selection signal line 181-*i*, the source electrode thereof is coupled to a j-th column video signal line 160, and the drain electrode thereof is coupled to the data line 114-*i* (i.e., the source electrode of the pixel TFT 116). Upon supply of a selection signal SELi of H level to the selection signal line 181-*i*, the TFT 172-*i* enters ON state, and as a result, the data line 114-*i* and the j-th column video signal line 160 are brought into a state of being electrically coupled to each other. That is, a data signal Sj is supplied to the data line 114-*i*. Upon supply of the selection signal SELi of L level to the selection signal line 181-*i*, the TFT 172-*i* enters OFF state, and as a result, the data line 114-*i* and the j-th column video signal line 160 are brought into a state of being electrically uncoupled to each other.

Figure 4:
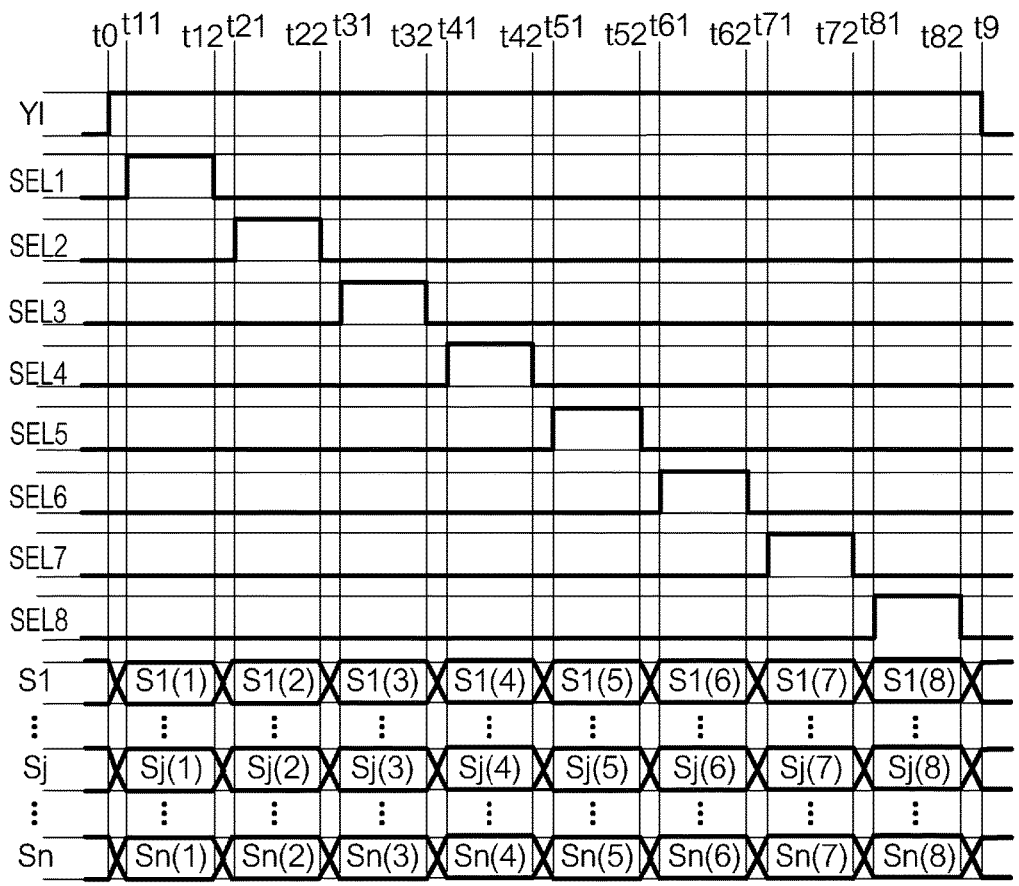
FIG. 4 is a timing chart illustrating the operation of the electro-optic apparatus according to the first embodiment.

FIG. 4 is a timing chart illustrating the operation of the electro-optic apparatus 1 during a period when an 1-th row scan line 112 has been supplied with a scan signal Y1 of H level (1 being a natural number). At a time point immediately before a time point t0, the scan signal Y1 and the selection signals SEL1 to SEL8 are each in L-level state. At the time point t0, the scan line driving circuit 210 changes the scan signal Y1 into H-level state from L-level state. Upon change of the scan signal Y1 into H-level state, each of pixel TFTs 116 corresponding to the 1-th row scan line 112 enters an electrically conductive state, and as a result, a corresponding data line 114 and a corresponding pixel electrode 118 are brought into a state of being electrically coupled to each other.

At a time point t11, the driving circuit 22A changes the selection signal SEL1 into H-level state. Upon change of the selection signal SEL1 into H-level state, for each of the demultiplexers 171, the TFT 172-1 enters ON state, and as a result, a j-th column video signal line 160 and the data line 114-1, which corresponds to the TFT 172-1, are brought into a state of electrically coupled to each other. At this time, the driving circuit 22A supplies the j-th column video signal line 160 with a data signal Sj(1). Thus, data corresponding to the data signal Sj(1) is written into a pixel electrode 118. At a time point t12, the driving circuit 22A changes the selection signal SEL1 into L-level state. Upon change of the selection signal SEL1 into L-level state, the TFT 172-1 enters OFF state, and as a result, the j-th column video signal line 160 and the data line 114-1 are brought into a state of being electrically uncoupled to each other.

At a time point t21, the drive circuit 22A changes the selection signal SEL2 into H-level state. Upon change of the selection signal SEL2 into H-level state, the TFT 172-2 enters ON state, and as a result, the j-th column video signal line 160 and the data line 114-2 are brought into a state of electrically coupled to each other. At this time, the driving circuit 22A supplies the j-th column video signal line 160 with a data signal Sj(2). Thus, data corresponding to the data signal Sj(2) is written into a pixel electrode 118. At a time point t22, the driving circuit 22A changes the selection signal SEL2 into L-level state. Upon change of the selection signal SEL2 into L-level state, the TFT 172-2 enters OFF state, and as a result, the j-th column video signal line 160 and the data line 114-2 are brought into a state of being electrically uncoupled to each other.

The driving circuit 22A executes similar processes while sequentially changing each of the selection signals SEL3 to SEL8 into H-level state. Specifically, at a time point ti1, the driving circuit 22A changes a selection signal SELi into H-level state. Upon change of the selection signal SELi into H-level state, a TFT 172-i enters ON state, and as a result, a j-th column video signal line 160 and a data line 114-i are brought into a state of electrically coupled to each other. At this time, the driving circuit 22A supplies the j-th column video signal line 160 with a data signal Sj(i). Thus, data corresponding to the data signal Sj(i) is written into a pixel electrode 118. At a time point ti2, the driving circuit 22A changes the selection signal SELi into L-level state. Upon change of the selection signal SELi into L-level state, the TFT 172-i enters OFF state, and as a result, the j-th column video signal line 160 and the data line 114-i are brought into a state of being electrically uncoupled to each other.

Further, at a time point t9, the scan line driving circuit 210 changes the scan signal Y1 into L-level state from H-level state. Upon change of the scan signal Y1 into L-level state, the pixel TFT 116 enters OFF state, and as a result, the pixel electrode 118 and any one of the data lines 114-1 to 114-8 are brought into a state of being electrically uncoupled state. Through the above operations, the writing of data into pixels corresponding to the 1-th row is completed. The electric charges having been written as data are retained until new data is written by the capacitance of the liquid crystal layer 119 and the storage capacitor 117. Next, the scan line driving circuit 210 changes a scan signal Y(l+1) into H-level state from L-level state. In this way, pieces of data are written into pixels corresponding to an (l+1)-th row. The scan line driving circuit 210 supplies scan signals that sequentially and exclusively become H level to the 1st row scan line 112, the 2nd row scan line 112, the 3rd row scan line 112, . . . , and the m-th row scan line 112. Upon completion of the writing from the 1st row to the m-th row, the writing of images for one frame is completed. The scan line driving circuit 210 supplies again scan signals that sequentially and exclusively become H level to the scan lines 112 in order from the 1st row scan line 112. In this way, the writing of images for a next frame is executed. The driving circuit 22A controls the polarity of the data signal S relative to the common voltage LCcom so as to allow the positive polarity and the negative polarity of the data signal S to be alternately interchanged every one frame. That is, the positive polarity and the negative polarity of the voltage supplied to the liquid crystal layer 119 are interchanged every one frame.

Figure 5:
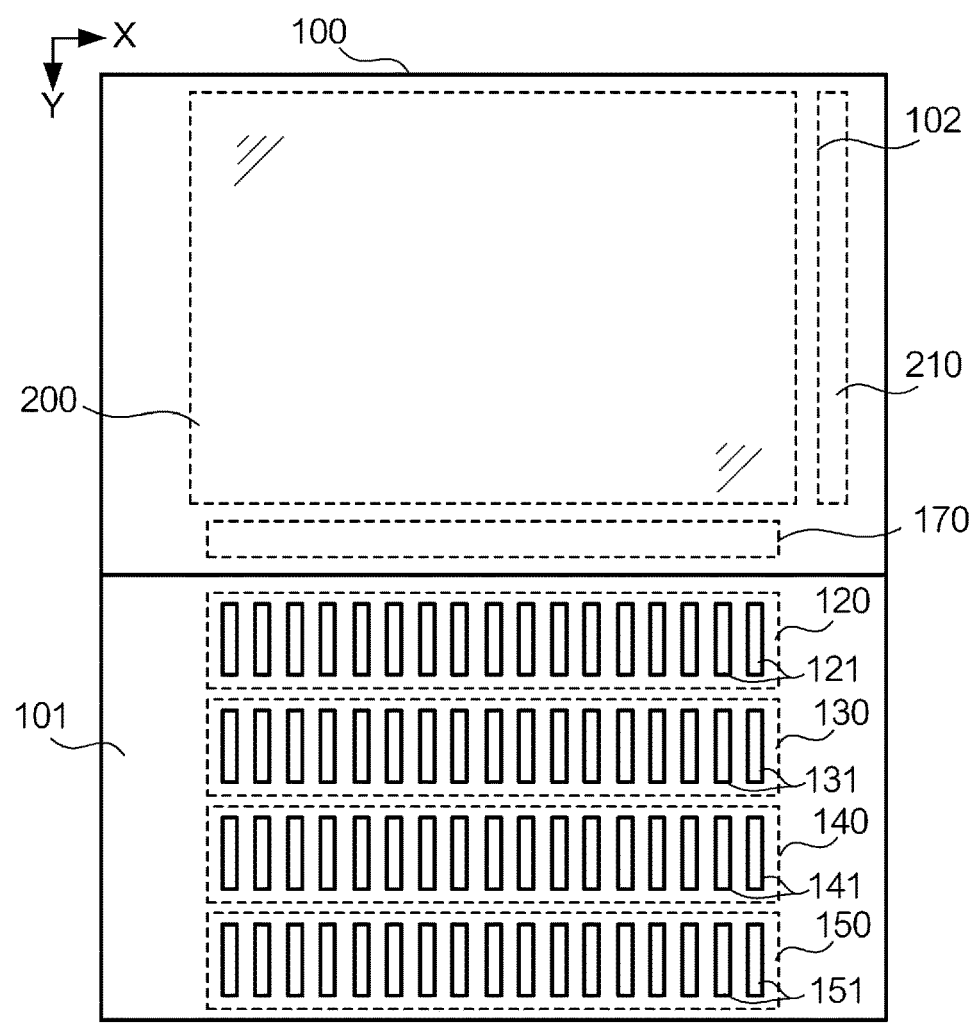
FIG. 5 is a front view of a liquid crystal panel according to the first embodiment illustrating a state in which a wiring substrate is not provided in the liquid crystal panel.

FIG. 5 is a front view of the liquid crystal panel 100 illustrating a state in which the wiring substrate 20A is not provided in the liquid crystal panel 100.

The liquid crystal panel 100 is configured such that an element substrate 101 and an opposite substrate 102 are bonded to each other so as to allow a constant space to be kept therebetween, and in this space, for example, a VA type liquid crystal is sealed. The pixel region 200 is formed on the element substrate 101, and a common electrode (omitted from illustration) is formed on the opposite substrate 102. Each of the element substrate 101 and the opposite substrate 102 is a substrate formed of a material having a light transmission property, such as glass or quartz.

The pixel region 200 of the element substrate 101 is formed on a face forming one side of the element substrate 101 and opposing the opposite substrate 102. On the face forming one side of the element substrate 101 and opposing the opposite substrate 102, the data line selection circuit 170 is formed along one side of a peripheral edge region of the pixel region 200 on the element substrate 101 (the peripheral edge region of the pixel region 200 being hereinafter referred to as just "a peripheral region"). The scan line driving circuit 210 is disposed along another side orthogonal to the relevant one side.

At the substrate edge side of the data line selection circuit 170 in the peripheral region on the element substrate 101, that is, at a position distanced from the pixel region 200, a plurality of terminals supplied with various signals for driving the liquid crystal panel 100 are formed, that is, a first terminal group 120, a second terminal group 130, a third terminal group 140, and a fourth terminal group 150 are formed across four rows.

The first terminal group 120 includes a plurality of terminals 121, and these plurality of terminals 121 are arranged in the X-direction. In this first embodiment, the plurality of terminals 121 have the same shape and the same size, and each of the plurality of terminals 121 has a rectangular shape in a front view. Further, in this first embodiment, the plurality of terminals 121 are arranged at equal pitches.

The second terminal group 130 includes a plurality of terminals 131, and these plurality of terminals 131 are arranged in the X-direction. The second terminal group 130 is located at a position that is more distanced from the pixel region 200 than the first terminal group 120. Specifically, the second terminal group 130 is located at a side opposite the pixel region 200 with the first terminal group 120 being interposed between the second terminal group 130 and the pixel region 200. In this first present embodiment, the plurality of terminals 131 have the same shape and the same size, and each of the plurality of terminals 131 has a rectangular shape in a front view. Further, in this first embodiment, the plurality of terminals 131 are arranged at equal pitches.

The third terminal group 140 includes a plurality of terminals 141, and these plurality of terminals 141 are arranged in the X-direction. The third terminal group 140 is located at a position that is more distanced from the pixel region 200 than the second terminal group 130. Specifically, the third terminal group 140 is located at a side opposite the pixel region 200 with the first terminal group 120 and the second terminal group 130 being interposed between the third terminal group 140 and the pixel region 200. In this first embodiment, the plurality of terminals 141 have the same shape and the same size, and each of the plurality of terminals 141 has a rectangular shape in a front view. Further, in this first embodiment, the plurality of terminals 141 are arranged at equal pitches.

The fourth terminal group 150 includes a plurality of terminals 151, and these plurality of terminals 151 are arranged in the X-direction. The fourth terminal group 150 is located at a position that is more distanced from the pixel region 200 than the third terminal group 140. Specifically, the fourth terminal group 150 is located at a side opposite the pixel region 200 with the first terminal group 120, the second terminal group 130, and the third terminal group 140 being interposed between the fourth terminal group 150 and the pixel region 200. In this first embodiment, the plurality of terminals 151 have the same shape and the same size, and each of the plurality of terminals 151 has a rectangular shape in a front view. Further, in this first embodiment, the plurality of terminals 151 are arranged at equal pitches.

In this first embodiment, a terminal 121, a terminal 131, a terminal 141, and a terminal 151 constitute one set, and the first terminal group 120, the second terminal group 130, the third terminal group 140, and the fourth terminal group 150 are supposed to be disposed so as to allow the terminal 121, the terminal 131, the terminal 141, and the terminal 151, which constitute the one set, to be located at the same position in the X-direction (the row direction). Further, a data signal may be input to any one of the terminals 121, 131, 141, and 151, which constitute the one group.

Here, each of the terminals 121, 131, and 141 corresponds to a first terminal according to the invention, and each of the terminals 131, 141, and 151 corresponds to a second terminal according to the invention.

Figure 6:
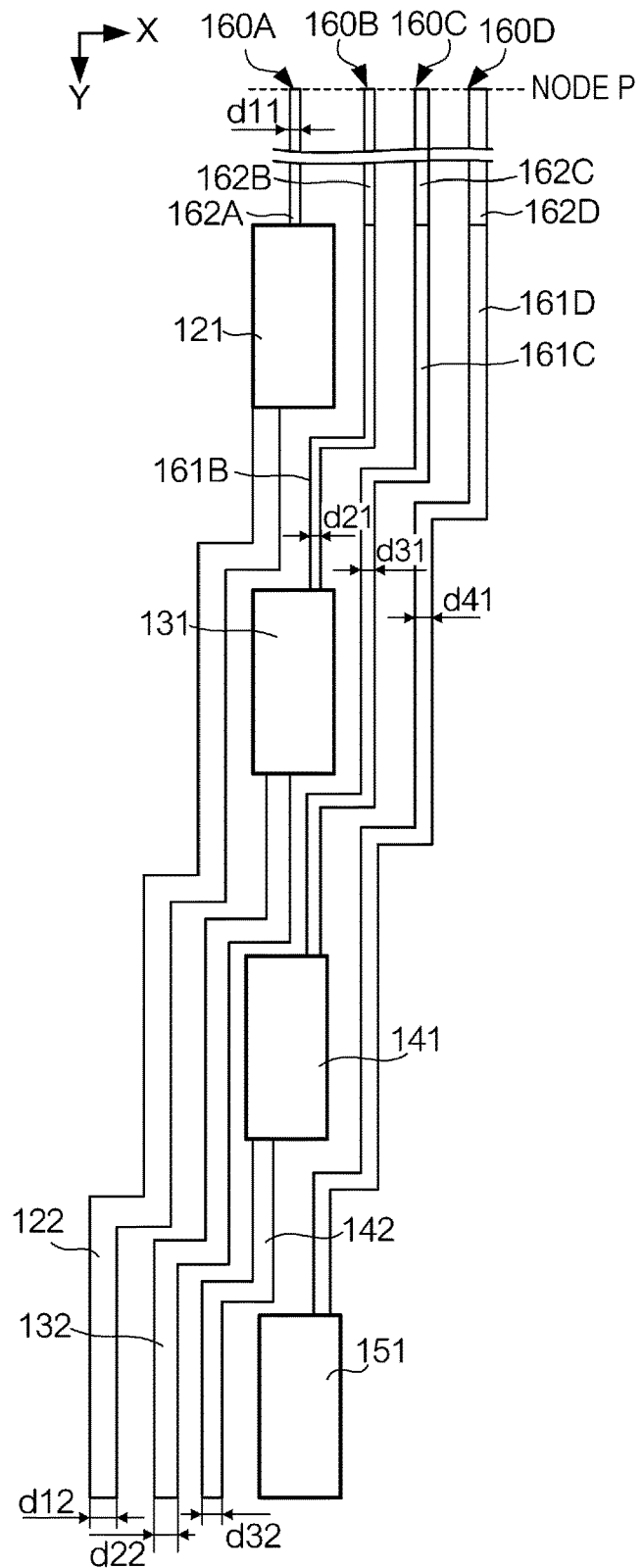
FIG. 6 is a diagram illustrating wirings extending from terminals of the liquid crystal panel according to the first embodiment.

FIG. 6 is a diagram illustrating the configuration of the terminals 121, 131, 141, and 151 and video signal lines 160A, 160B, 160C, and 160D in the liquid crystal panel 100. Here, the video signal lines 160A, 160B, 160C, and 160D constitute the video signal lines 160, and are respectively coupled to the terminals 121, 131, 141, and 151. One end of the video signal line 160A is coupled to the terminal 121, and the other end thereof is coupled to the node P (the branch point, see FIG. 2) corresponding to the video signal line 160A; one end of the video signal line 160B is coupled to the terminal 131, and the other end thereof is coupled to the node P corresponding to the video signal line 160B; one end of the video signal line 160C is coupled to the terminal 141, and the other end thereof is coupled to the node P corresponding to the video signal line 160C; and one end of the video signal line 160D is coupled to the terminal 151, and the other end thereof is coupled to the node P corresponding to the video signal line 160D.

The video signal line 160A is configured to include a wiring 162A. The wiring 162A is a wiring extending from the terminal 121 to the node P, corresponding to the video signal line 160A. The line width of the wiring 162A is denoted by d11. The video signal 160B is configured to include a wiring 161B and a wiring 162B. One end of the wiring 161B is coupled to the terminal 131, and the other end thereof is coupled to one end of the wiring 162B. The other end of the wiring 162B is coupled to the node P, corresponding to the video signal 160B. The line width of each of the wirings 161B and 162B is denoted by d21. The wiring 161B includes a portion bent at an angle of approximately 90 degrees and portions each extending in a straight line shape. The video signal 160C is configured to include a wiring 161C and a wiring 162C. One end of the wiring 161C is coupled to the terminal 141, and the other end thereof is coupled to one end of the wiring 162C. The other end of the wiring 162C is coupled to the node P, corresponding to the video signal 160C. The line width of each of the wirings 161C and 162C is denoted by d31. The wiring 161C includes portions each being bent at an angle of approximately 90 degrees and portions each extending in a straight line shape. The video signal 160D is configured to include a wiring 161D and a wiring 162D. One end of the wiring 161D is coupled to the terminal 151, and the other end thereof is coupled to one end of the wiring 162D. The other end of the wiring 162D is coupled to the node P, corresponding to the video signal 160D. The line width of each of the wirings 161D and 162D is denoted by d41. The wiring 161D includes portions each being bent at an angle of approximately 90 degrees, and portions each extending in a straight line shape.

The boundary between the wiring 161B and the wiring 162B, the boundary between the wiring 161C and the wiring 162C, and the boundary between the wiring 161D and the wiring 162D are supposed to be located at the same position as the position of the boundary between the terminal 121 and the wiring 162A in the Y-direction (the column direction).

As described above, the terminals 151, 141, 131, and 121 are disposed at positions distanced from the pixel region 200 such that the distances from the terminals 151, 141, 131, and 121 to the pixel region 200 are increased in this order. Thus, the wiring lengths of the video signal lines 160D, 160C, 160B, and 160A are increased in this order. Moreover, the video signal lines 160A, 160B, 160C, and 160D are made of the same material (for example, aluminum), and are formed so as to have the same thickness. In this case, when the line widths of the video signal lines 160A, 160B, 160C, and 160D are made equal to one another (i.e., d11=d21=d31=d41), resistance differences due to the differences among the wiring lengths of the video signal lines 160A, 160B, 160C, and 160D arise among paths each including a corresponding one of the video signal lines 160A, 160B, 160C, and 160D and used for transmitting a corresponding data signal. Specifically, the resistances of the video signal lines 160D, 160C, 160B, and 160A are increased in this order.

In the liquid crystal panel 100, the path of a signal transmitted to one of the pixels 111 is specified by a path from one of output terminals 320A, 320B, 320C, and 320D of the driving circuit 22A (see FIG. 8) to the one of the pixels 111. In this case, the occurrence of the differences among the resistances of the video signal lines 160A, 160B, 160C, and 160D causes display unevenness in the display region 200, and this display unevenness is likely to become a cause of the degradation of display quality. Thus, in this first embodiment, the line widths of the wirings for the video signal lines 160D, 160C, 160B, and 160A are set so as to cause the line widths of the wirings for the video signal lines 160D, 160C, 160B, and 160A to be increased in this order, that is, so as to satisfy an inequality: d41>d31>d21>d11. This configuration enables the differences among the resistances of the paths for transmitting data signals to be smaller than resistance differences due to the differences among the lengths of the wirings for the paths. The resistances of the video signal lines 160D, 160C, 160B, and 160A are preferable to be equal to one another. In this case, the line widths d11, d21, d31, and d41 are set so as to satisfy, for example, the following relation formulas:

$$d11 = Rc1/(Rc4+R4)*d41$$

$$d21 = (Rc2+R2)/(Rc4+R4)*d41$$

$$d31 = (Rc3+R3)/(Rc4+R4)*d41$$

$$d41 = d41$$

Here, the wirings 161B, 161C, and 161D are portions whose resistances vary in accordance with the positions of the terminals 131, 141, and 151 (the positions in the Y-direction), and the resistances of the wirings 161B, 161C, and 161D are denoted by R2, R3, and R4. The wirings 162A, 162B, 162C, and 162D are portions whose resistances do not vary in accordance with the positions of the terminals 121, 131, 141, and 151 (the positions in the Y-direction), and the resistances of the wirings 162A, 162B, 162C, and 162D are denoted by Rc1, Rc2, Rc3, and Rc4.

Figure 7:
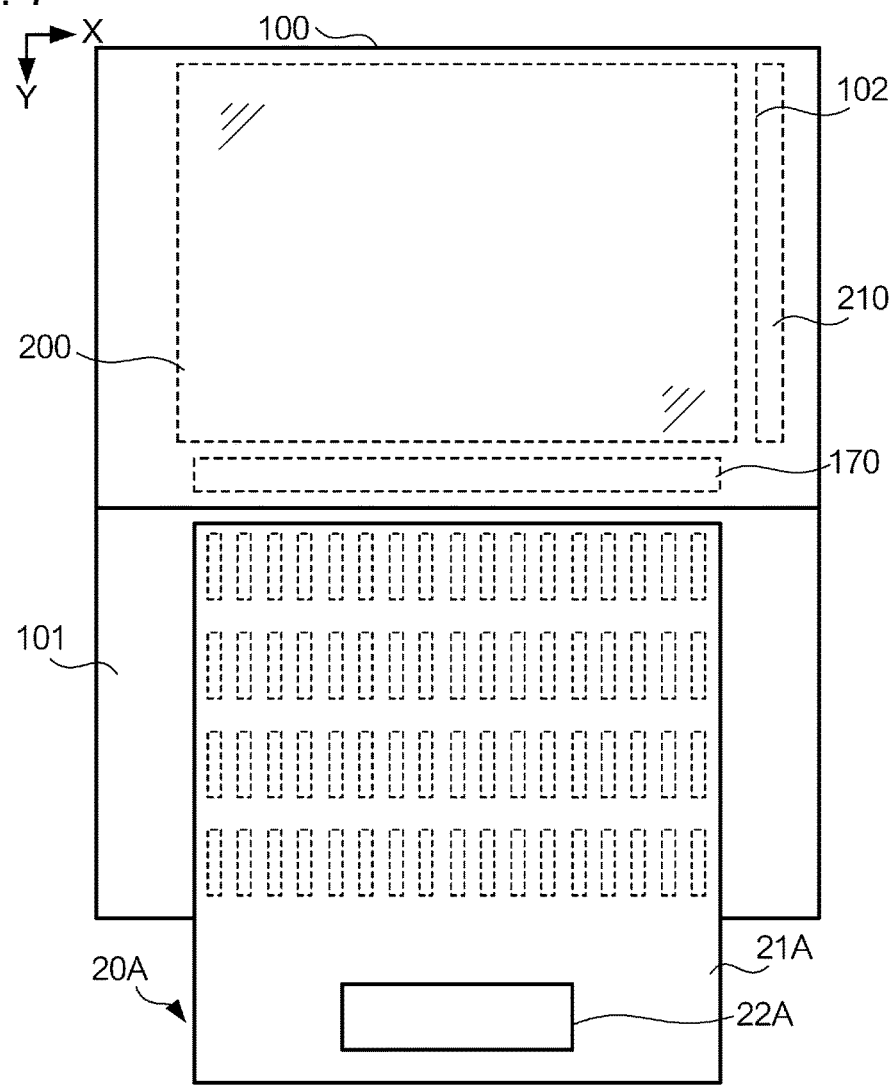
FIG. 7 is a front view of the liquid crystal panel according to the first embodiment illustrating a state in which the wiring substrate is provided in the liquid crystal panel (FIG. 7 being a diagram when viewed from a direction indicated by an arrow VII of FIG. 1).

FIG. 7 is a front view of the liquid crystal panel 100 illustrating a state in which one wiring substrate 20A is provided for the terminals of the liquid crystal panel 100. Here, FIG. 7 is a diagram when viewed from a direction indicated by an arrow VII of FIG. 1. In FIG. 7, the case 10 is omitted from the illustration. On the back face of the FPC 21A of the wiring substrate 20A, coupling regions for use in electric coupling to the FPC 21A are formed so as to be each associated with a corresponding one of the first terminal group 120, the second terminal group 130, and the third terminal group 140, and the fourth terminal group 150.

Figure 8:
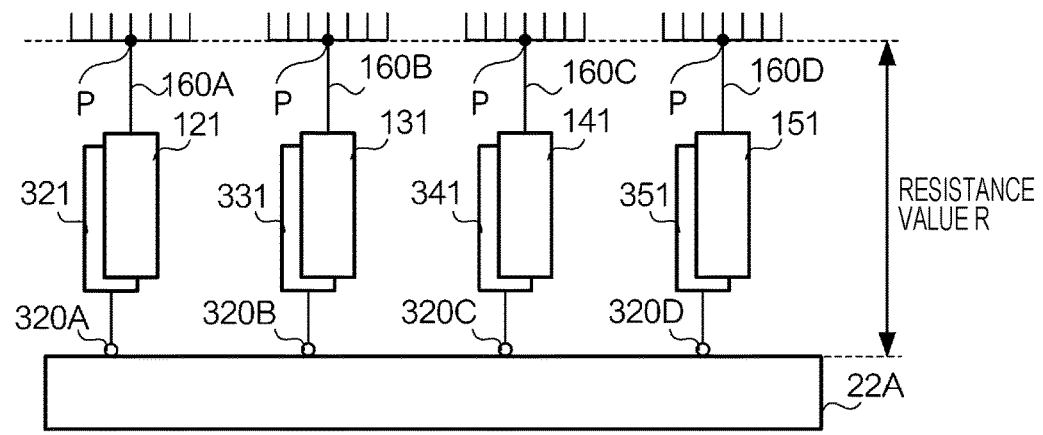
FIG. 8 is a diagram illustrating the interconnection between a driving circuit and the liquid crystal panel, according to the first embodiment.

FIG. 8 is a diagram schematically illustrating the interconnection between the liquid crystal panel 100 and the driving circuit 22A on the wiring substrate 20A. In FIG. 8, in order to make it easy to understand description, the position of each coupling region of the wiring substrate 20A and the position of a corresponding terminal disposed on the liquid crystal panel 100 and coupled to the each coupling region are illustrated so as not to fully overlap with each other. Further, FIG. 8 illustrates the wirings and the coupling relations with respect to the terminals 121, 131, 141, and 151, the positions of which in the X-direction are the same.

The terminal 121 is brought into contact with a coupling region 321 of the wiring substrate 20A. The terminal 131 is brought into contact with a coupling region 331 of the wiring substrate 20A. The terminal 141 is brought into contact with a coupling region 341 of the wiring substrate 20A. The terminal 151 is brought into contact with a coupling region 351 of the wiring substrate 20A.

The driving circuit 22A includes output terminals 320A, 320B, 320C, and 320D. The output terminals 320A, 320B, 320C, and 320D serve as output terminals for outputting data signals. The output terminal 320A is coupled to the coupling region 321; the output terminal 320B is coupled to the coupling region 331; the output terminal 320C is coupled to the coupling region 341; and the output terminal 320D is coupled to the coupling region 351. Thus, a data signal output from the output terminal 320A is input to the terminal 121 via the coupling region 321; a data signal output from the output terminal 320B is input to the terminal 131 via the coupling region 331; a data signal output from the output terminal 320C is input to the terminal 141 via the coupling region 341; and a data signal output from the output terminal 320D is input to the terminal 151 via the coupling region 351.

Moreover, in this first embodiment, a resistance from the output terminal 320A of the driving circuit 22A to the node P on the video signal line 160A, a resistance from the output terminal 320B of the driving circuit 22A to the node P on the video signal line 160B, a resistance from the output terminal 320C of the driving circuit 22A to the node P on the video signal line 160C, and a resistance from the output terminal 320D of the driving circuit 22A to the node P on the video signal line 160D are equal to one another, and the value of the resistance is denoted by "R". That is, for the individual pixel groups having been described in FIG. 2, the resistances of the paths for transmitting data signals thereto are equal to one another. The above phrase "resistances are equal to one another" means that the resistances are caused to be equal to one another in view of design concept at minimum. That is, the resistances of the video signal lines 160A, 160B, 160C, and 160D do not necessarily strictly coincide with one another, and are permitted to have differences among the resistances thereof due to, for example, manufacturing errors.

Here, one of the pixels 111 that is supplied with a data signal (corresponding to a first signal according to the invention) from any one output terminal among the output terminals 320A to 320D of the driving circuit 22A corresponds to a first pixel according to the invention, and another one of the pixels 111 that is supplied with another data signal (corresponding to a second signal according to the invention) from any other output terminal among the output terminals 320A to 320D of the driving circuit 22A corresponds to a second pixel according to the invention. Further, one video signal line included in the video signal lines 160A, 160B, and 160C corresponds to a first wiring according to the invention, and another video signal line included in the video signal lines 160B, 160C, and 160D corresponds to a second wiring according to the invention.

By the way, with the provision of differences among the line widths of the wirings for the video signal lines 160A, 160B, 160C, and 160D, variations among the capacitances of the wirings due to the provided differences among the line widths of the wirings are likely to occur, and this variations among the capacitances of the wirings are likely to become a cause of the degradation of display quality in the pixel region 200. In order to reduce this degradation of display quality, the liquid crystal display panel 100 is further configured in such a way as described below.

As shown in FIG. 6, a wiring 122 extends from the terminal 121 in a direction away from the pixel region 200. The line width of the wiring 122 is denoted by d12. A wiring 132 extends from the terminal 131 in the direction away from the pixel region 200. The line width of the wiring 132 is denoted by d22. A wiring 142 extends from the terminal 141 in the direction away from the pixel region 200. The line width of the wiring 142 is denoted by d32. Here, the wirings 122, 132, and 142 are made of the same material (for example, aluminum), and are formed so as to have the same thickness.

The wirings 122, 132, and 142 are so-called dummy wirings, that is, wirings not used for the purpose of transmitting signals, such as data signals. Each of the wirings 122, 132, and 142 includes at least one portion bent at an angle of approximately 90 degrees and portions each extending in a straight line shape. The ends of the wirings 122, 132, and 142 opposite the terminals 121, 131, and 141 are terminated at approximately the same position in the Y-direction. Thus, the lengths of the wirings 122, 132, and 142 are increased in this order. In this regard, however, the line widths of the wirings 122, 132, and 142 are different from one another. Specifically, the line widths of the wirings 122, 132, and 142 are set so as to satisfy an inequality: $d12>d22>d32$.

Here, one wiring included in the wirings 132 and 142 corresponds to a third wiring according to the invention, and another wiring included in the wirings 122 and 132 corresponds to a fourth wiring according to the invention.

As described above, providing differences among the line widths of the wirings for the video signal lines 160A, 160B, 160C, and 160D is likely to increase the differences among the capacitances of the wirings. In this case, disposing the wirings 122, 132, and 142 and further providing differences among the line widths of the wirings 122, 132, and 142 enable the differences among the capacitances of the wirings to be reduced, and preferably enable the capacitances of the wirings to be equal to one other. That is, the smaller the line width of a video signal line 160 coupled to a certain terminal is, a wiring having a larger width is coupled to the certain terminal as a dummy to allow a larger amount of capacitance to be added to the video signal line 160.

As described above, in the electro-optic apparatus 1, even when terminals are formed across a plurality of rows, the line widths of a plurality of wirings each coupled to a corresponding one of the terminals are set so as to allow the differences among the resistances of the plurality of wirings due to the positions of the terminals to be reduced. With this configuration, the degradation of display quality due to the differences among the distances from the terminals to the pixel region is reduced. Moreover, providing the dummy wirings reduces the increase of the differences among the capacitances of the wirings due to the setting of the line widths of the wirings, and thus, the degradation of display quality due to the increase of the differences among the capacitances of the wirings is also reduced.

Second Embodiment

Next, a second embodiment of the invention will be described. This second embodiment is different from the above first embodiment in a respect that the widths of the terminals are set so as to reduce the differences among the resistances of the plurality of wirings due to the positions of the terminals.

The items relating to FIGS. 1 to 8 and having been described in the above first embodiment are also applied to this second embodiment, but duplicated description on the items will be omitted in the following description.

Figure 9:
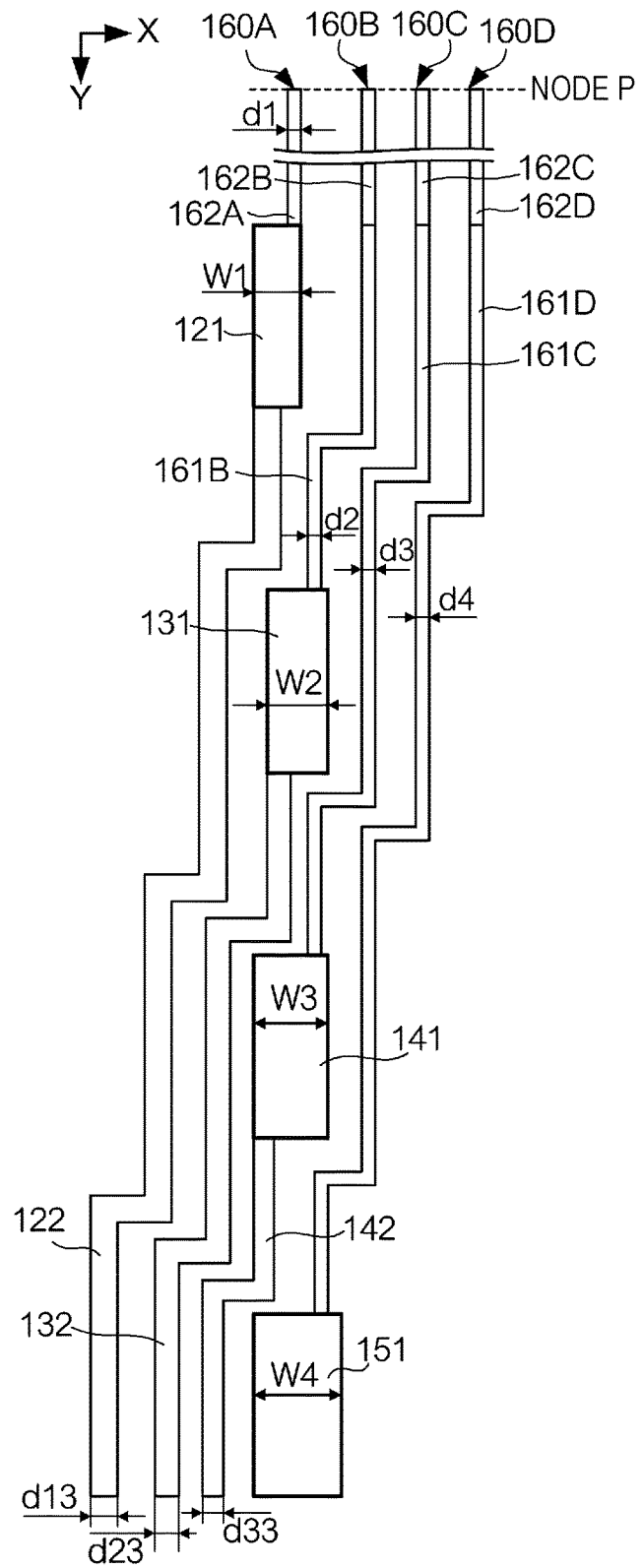
FIG. 9 is a diagram illustrating wirings extending from terminals of a liquid crystal panel according to a second embodiment of the invention.

FIG. 9 is a diagram illustrating the configuration of video signals 160A, 160B, 160C, and 160D in this second embodiment. In this second embodiment, the line widths of the video signal lines 160A, 160B, 160C, and 160D are denoted by d1, d2, d3, and d4. Further, a relation represented by an inequality: d1=d2=d3=d4 is satisfied, that is, the line widths of the video signal lines 160A, 160B, 160C, and 160D are equal to one another. In contrast, the same differences as those in the above first embodiment exist among the wiring lengths of the video signal lines 160A, 160B, 160C, and 160D. In this second embodiment, in order to reduce the differences among the resistances of the wirings due to the differences among the wiring lengths, the widths of the terminals 151, 141, 131, and 121 are set so as to be increased in this order. That is, when the widths of the terminals 151, 141, 131, and 121 are denoted by W4, W3, W2, and W1, a relation represented by an inequality: W4>W3>W2>W1 is satisfied. With this configuration, the differences among the resistances of the paths for supplying data signals are made smaller than resistance differences due to the differences among the lengths of the wirings for the video signal lines 160A, 160B, 160C, and 160D. Thus, the degradation of display quality in the pixel region 200 is reduced in a mechanism similar to that in the above first embodiment.

Moreover, wirings 122, 132, and 142 extend from the respective terminals 121, 131, and 141 in the same way as that in the above first embodiment. The lengths of the wirings 122, 132, and 142 are increased in this order. In this case, when the line widths of the wirings 122, 132, and 142 are denoted by d13, d23, and d33, a relation represented by an inequality: d13>d23>d33 is satisfied. This configuration reduces the increase of the differences among the capacitances of the wirings due to the settings of the widths of the terminals, and thus, the degradation of display quality due to the increase of the differences among the capacitances of the wirings is reduced.

Third Embodiment

Next, a third embodiment of the invention will be described. This third embodiment is different from the above first embodiment in a respect that a plurality of wiring substrates are coupled to the liquid crystal panel 100. The configuration of the liquid crystal panel 100 is the same as that of each of the first embodiment and the second embodiment.

Figure 10:
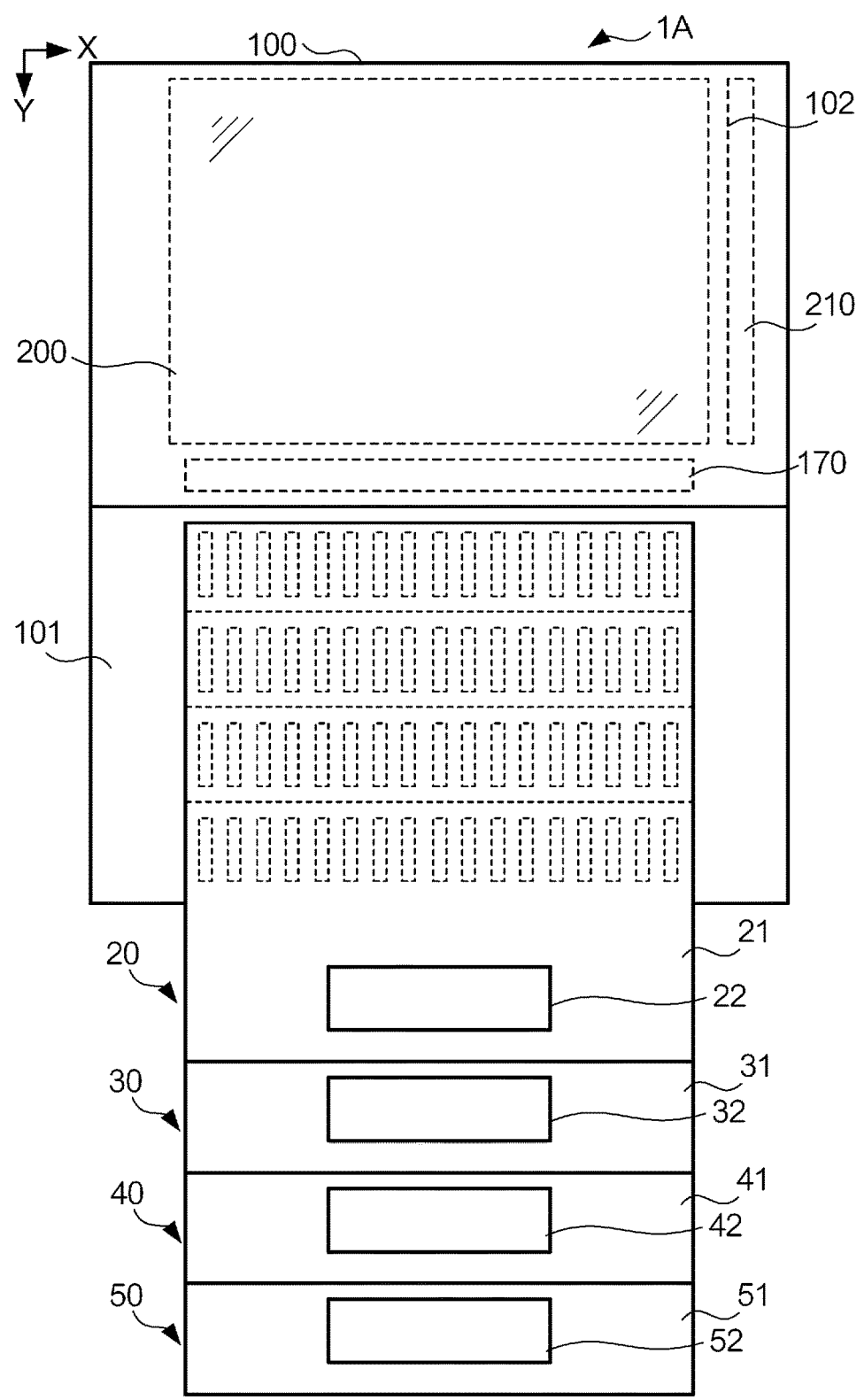
FIG. 10 is a front view of a liquid crystal panel according to a third embodiment of the invention illustrating a state in which wiring substrates are provided in the liquid crystal panel.

In FIG. 10, an electro-optic apparatus 1A according to this third embodiment includes the liquid crystal panel 100, a first wiring substrate 20, a second wiring substrate 30, a third wiring substrate 40, and a fourth wiring substrate 50. The first wiring substrate 20 includes a driving circuit 22, the second wiring substrate 30 includes a driving circuit 32; the third wiring substrate 40 includes a driving circuit 42; and the fourth wiring substrate 50 includes a driving circuit 52. Each of the first wiring substrate 20, the second wiring substrate 30, the third wiring substrate 40, and the fourth wiring substrate 50 is a chip-on-film (COF), and has the same function. The four driving circuits, that is, the driving circuits 22, 32, 42, and 52, drive the liquid crystal panel 100, and are capable of driving data lines (pixels) whose number is four times as many as the number of data lines (pixels) that one driving circuit is capable of driving. The first wiring substrate 20, the second wiring substrate 30, the third wiring substrate 40, and the fourth wiring substrate 50 have the same configuration as that of the wiring substrate 20A in the first embodiment, and respectively include an FPC 21, an FPC 31, an FPC 41, and an FPC 51 as their base substrates. On the back face of one end of each of the FPCs 21, 31, 41, and 51, there are formed coupling regions each associated with and electrically coupled to one of terminals included in a corresponding one of the first terminal group 120, the second terminal group 130, the third terminal group 140, and the fourth terminal group 150 of the liquid crystal panel 100.

The first wiring substrate 20 is coupled to the plurality of terminals 121 included in the first terminal group 120 of the liquid crystal panel 100. One end of the first wiring substrate 20 is disposed on the element substrate 101. The second wiring substrate 30 is coupled to the plurality of terminals 131 included in the second terminal group 130 of the liquid crystal panel 100. One end of the second wiring substrate 30 is disposed on the element substrate 101. The third wiring substrate 40 is coupled to the plurality of terminals 141 included in the third terminal group 140 of the liquid crystal panel 100. One end of the third wiring substrate 40 is disposed on the element substrate 101. The fourth wiring substrate 50 is coupled to the plurality of terminals 151 included in the fourth terminal group 150 of the liquid crystal panel 100. One end of the fourth wiring substrate 50 is disposed on the element substrate 101. The coupling regions of the first wiring substrate 20 that are coupled to the terminals 121 are disposed so as not overlap with the second wiring substrate 30, the third wiring substrate 40, and the fourth wiring substrate 50 in a Z-axis direction. The coupling regions of the second wiring substrate 30 that are coupled to the terminals 131 are disposed so as to overlap with the first wiring substrate 20 in the Z-axis direction. The coupling regions of the third wiring substrate 40 that are coupled to the terminals 141 are disposed so as to overlap with the first wiring substrate 20 and the second wiring substrate 30 in the Z-direction. The coupling regions of the fourth wiring substrate 50 that are coupled to the terminals 151 are disposed so as to overlap with the first wiring substrate 20, the second wiring substrate 30, and the third wiring substrate 40 in the Z-direction.

Figure 11:
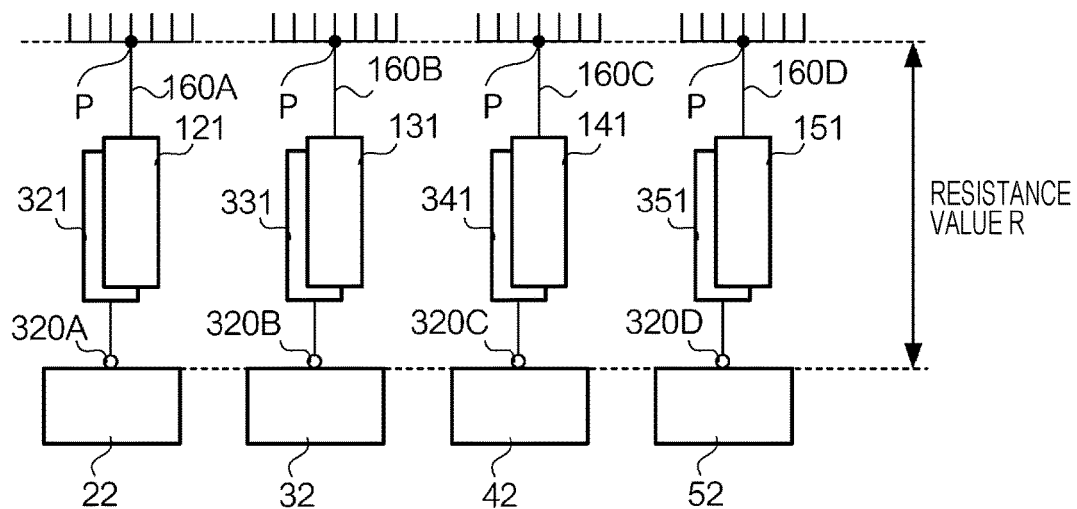
FIG. 11 is a diagram illustrating the interconnections between driving circuits and the liquid crystal panel, according to the third liquid crystal panel.

FIG. 11 is a schematic diagram illustrating the coupling relations between driving circuits 22, 32, 42, and 52 and the liquid crystal panel 100. The configuration shown in FIG. 11 is different from that shown in FIG. 8 in a respect that coupling regions 321, 331, 341, and 351 are coupling regions of the respective first wiring substrate 20, second wiring substrate 30, third wiring substrate 40, and fourth wiring substrate 50, and output terminals 320A, 320B, 320C, and 320D are output terminals of the respective driving circuits 22, 32, 42, and 52.

The configuration from the output terminal 320A of the driving circuit 22 on the first wiring substrate 20 to the coupling region 321, the configuration from the output terminal 320B of the driving circuit 32 on the second wiring substrate 30 to the coupling region 331, the configuration from the output terminal 320C of the driving circuit 42 on the third wiring substrate 40 to the coupling region 341, and the configuration from the output terminal 320D of the driving circuit 52 on the fourth wiring substrate 50 to the coupling portion 351 are the same. That is, in this third embodiment, similarly, the resistance from the output terminal 320A to the node P on the video signal line 160A of the liquid crystal panel 100, the resistance from the output terminal 320B to the node P on the video signal line 160B, the resistance from the output terminal 320C to the node P on the video signal line 160C, and the resistance from the output terminal 320D to the node P on the video signal line 160D are equal to one another, and the resistance value thereof is "R".

Here, one of the pixels 111 that is supplied with a data signal (corresponding to the first signal) from any one output terminal among the output terminals 320A to 320D of the driving circuits corresponds to the first pixel, according to the invention, and another one of the pixels 111 that is supplied with another data signal (corresponding to the second signal) from any other output terminal among the output terminals 320A to 320D of the driving circuits corresponds to the second pixel, according to the invention. Further, one video signal line included in the video signal lines 160A, 160B, and 160C corresponds to the first wiring, according to the invention, and another video signal line included in the video signal lines 160B, 160C, and 160D corresponds to the second wiring, according to the invention. Modification Examples The invention may be practiced in forms different from those of the aforementioned embodiments. Further, any ones of modification examples described below may be combined with one another in accordance with a situation.

The configurations of the aforementioned first and second embodiments may be combined with each other. That is, in the electro-optic apparatus 1, in order to make the differences among the resistances of a plurality of paths for transmitting data signals smaller than resistance differences due to the differences among the lengths of the wirings from the individual terminals to the nodes P, both of the line widths of the wirings and the widths of the terminals may be set.

Moreover, in order to reduce the differences among the resistances of the plurality of paths for transmitting data signals, methods other than the settings of both of the line widths of the wirings and the widths of the terminals may be employed. Non-limiting examples of such methods other than the settings include the selection of a material forming the wirings and/or a material forming the terminals, and the adjustment of the shape of each of the wirings and/or the shape of each of the terminals.

In the aforementioned embodiments, the line widths of the wirings or the widths of the terminals are set on the basis of the resistances from the data signal output terminals of one driving circuit or a plurality of driving circuits to the nodes P on the video signal lines 160. The line widths of the wirings or the widths of the terminals may be set, without being limited to the above method, on the basis of resistances from the data signal output terminals of the driving circuit 22A or the driving circuits 22, 32, 42, and 52 to any other mutually corresponding points on the respective video signal lines 160. For example, the any other mutually corresponding points are the source electrodes of the TFTs 172-$i$ coupled to the other ends of the respective video signal lines 160. That is, the line widths of the wirings or the widths of the terminals may be set on the basis of resistances up to mutually corresponding positions on the plurality of video signal lines 160.

Further, in the case where the resistances from the plurality of output terminals of the driving circuit 22A or the driving circuits 22, 32, 42, and 52 to the coupling regions are already known, the line widths of the wirings and/or the widths of the terminals may be set on the basis of resistances from the individual terminals formed in the liquid crystal panel 100 to mutually corresponding positions on the plurality of video signal lines 160. That is, the path of a signal transmitted to one of the pixels 111 may be specified by a path from one of the terminals 121, 131, 141, and 151 to the one of the pixels 111.

The number of the terminal groups included in the liquid crystal panel 100 is not limited to four, but may be two, three, five or more. Further, the number of the wiring substrates coupled to the liquid crystal panel may be two, three, five or more in accordance with the number of the terminal groups. In this case, the longer the length of a wiring for a video signal line 160 coupled to a terminal is, the line width of the wiring for the video signal line 160 coupled to the terminal may be made larger or the width of the terminal may be made larger.

Further, in embodiments of the invention, the dummy wirings for adjusting the differences among the capacitances of the wirings (that is, the wirings 122, 132, and 142) may not be provided.

Here, the setting of the wiring widths, having been described in FIG. 6, is simply required to be made at minimum on wirings for transmitting signals to be supplied to the pixels, and the setting of the terminal widths, having been described in FIG. 9, is simply required to be made at minimum on terminals for transmitting signals to be supplied to the pixels.

The electro-optic panel according to the invention may not be the transmissive liquid crystal panel, but may be a reflective liquid crystal panel. Further, the electro-optic panel according to the invention is simply required to perform electro-optic operation, and thus, may be a panel, such as an organic electro-luminescence (EL) panel, using electro-optic elements other than the liquid crystal.

Figure 12:
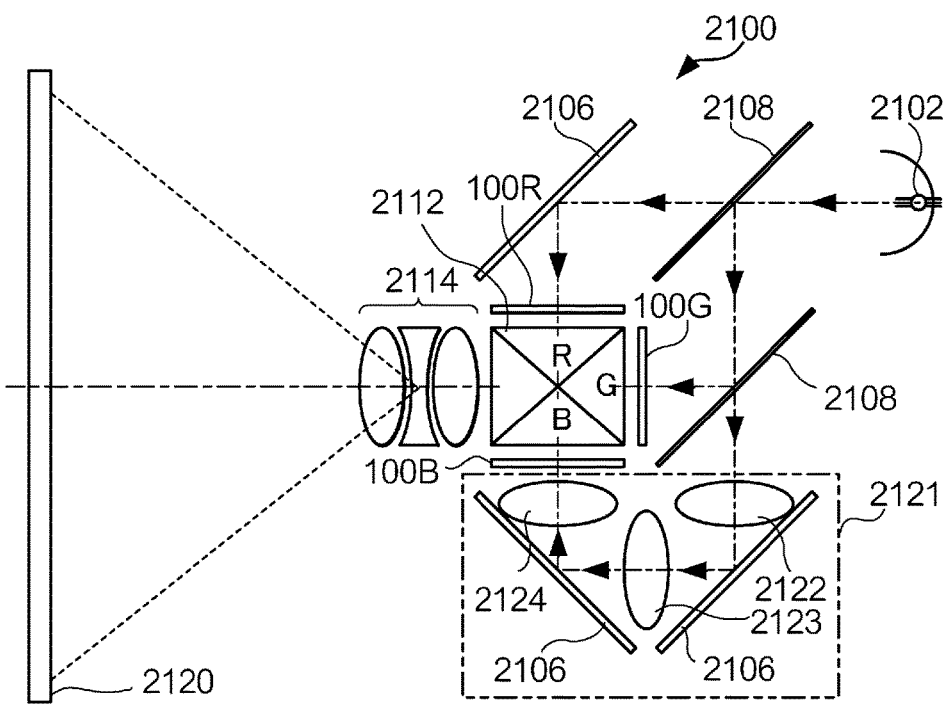
FIG. 12 is a diagram illustrating a projector to which the electro-optic apparatus according to any one of the first, second, and third embodiments of the invention is applied.

Next, a projection type display apparatus (projector) using the liquid crystal apparatus 100 will be described as one example of an electronic device using the electro-optic apparatus 1 or the electro-optic apparatus 1A according to the aforementioned embodiments. FIG. 12 is a plan view of this projector illustrating a configuration of this projector.

As shown in FIG. 12, a lump unit 2102 is disposed inside a projector 2100. The lump unit 2102 includes a white-color light source, such as a halogen lamp. Light rays emitted from the lamp unit 2102 are separated into three primary-color light rays, that is, an R-color light ray, a G-color light ray, and a B-color light ray, by three mirrors 2106, disposed inside the projector 2100, and two dichroic mirrors 2108, disposed inside the projector 2100, and the separated primary-color light rays are each guided to a corresponding one of light valves 100R, 100G, and 100B, associated with the respective primary colors. Here, the light path of the B-color light ray is longer than those of the other R-color and G-color light rays, and thus, for the purpose of the prevention of a loss due to the long light path, the B-color light ray is guided via a relay lens system 2121. This relay lens system 2121 includes an input lens 2122, a relay lens 2123, and an output lens 2124.

In the projector 2100, three electro-optic apparatus each being the electro-optic apparatus 1 or the electro-optic apparatus 1A, which includes the liquid crystal panel 100, are disposed. The configuration of each of the light valves 100R, 100G, and 100B is the same as that of the above-described liquid crystal panel 100. The light valve 100R, the light valve 100G, and the light valve 100B are configured to be respectively driven by a video signal supplied from an outside and upper-layer circuit and composed of R-color primary elements, a video signal supplied from an outside and upper-layer circuit and composed of G-color primary elements, and a video signal supplied from an outside and upper-layer circuit and composed of B-color primary elements.

Light rays having been modulated by the respective light valves 100R, 100G, and 100B are input to a dichroic prism 2112 from three directions. Further, in this dichroic prism 2112, each of the modulated R-color light ray and the modulated B-color light ray is refracted by 90 degrees, while the modulated G-color light ray goes straight. Accordingly, after the individual primary-color images have been combined, as a result, a color image is projected onto a screen 2120 by a projection lens 2114.

Here, there is no need for providing color filters in the respective light valves 100R, 100G, and 100B because light rays each associated with a corresponding one of the R, G, and B colors are input to the respective light valves 100R, 100G, and 100B by the dichroic mirrors 2108. Further, images having been transmitted through the light valves 100R and 100B are projected after having been reflected by the dichroic prism 2112, whereas an image having been transmitted through the light valve 100G is projected as it is, and thus, the horizontal scan direction in each of the light valves 100R and 100B is configured to be made reverse to the horizontal scan direction in the light valve 100G to display an image having been mirror-reversed.

Non-limiting examples of the electronic device includes, in addition to the projector having been described referring to FIG. 12, a television set, a viewfinder type/monitor-direct-view type video tape recorder, a car navigation device, a pager, an electronic personal organizer, an electric calculator, a word processor, a workstation, a TV telephone, a POS terminal, a digital still camera, a mobile telephone, a smart phone, a tablet-type terminal, and any other terminal with a touch panel. Further, the electro-optic apparatus 1 is applicable to these various electronic devices.

The entire disclosure of Japanese Patent Application No. 2016-146023, filed Jul. 26, 2016 is expressly incorporated by reference herein.

What is claimed is:

1. An electro-optic apparatus comprising:
   an element substrate;
   a pixel region including a first pixel and a second pixel and formed on the element substrate;
   a first terminal formed on the element substrate;
   a second terminal formed on the element substrate and located at a side opposite the pixel region with the first terminal being interposed between the pixel region and the second terminal;
   a first wiring extending from the first terminal and included in a path for transmitting, to the first pixel, a first signal having been input to the first terminal;
   a second wiring extending from the second terminal and included in a path for transmitting, to the second pixel, a second signal having been input to the second terminal;
   a first wiring substrate including a first coupling region which is in contact with the first terminal; and
   a second wiring substrate including a second coupling region which is in contact with the second terminal,
   wherein a difference between a resistance of the path for transmitting the first signal and a resistance of the path for transmitting the second signal is made smaller than a resistance difference due to a difference between a length of the first wiring and a length of the second wiring.

2. The electro-optic apparatus according to claim 1, wherein a width of the second wiring is larger than a width of the first wiring.

3. The electro-optic apparatus according to claim 1, wherein a width of the second terminal is larger than a width of the first terminal.

4. The electro-optic apparatus according to claim 2,
   wherein a third wiring extends from the first terminal and a fourth wiring extends from the second terminal, and
   wherein a width of the third wiring is larger than a width of the fourth wiring.

5. An electronic device comprising the electro-optic apparatus according to claim 1.

6. An electronic device comprising the electro-optic apparatus according to claim 2.

7. An electronic device comprising the electro-optic apparatus according to claim 3.

8. An electronic device comprising the electro-optic apparatus according to claim 4.

9. The electro-optic apparatus according to claim 1, wherein the first wiring substrate includes a driving circuit.

10. An electro-optic apparatus comprising:
    an element substrate;
    a pixel region including a first pixel and a second pixel and formed on the element substrate;
    a first terminal formed on the element substrate;
    a second terminal formed on the element substrate, the first terminal being located between the pixel region and the second terminal;
    a first wiring extending from the first terminal to the first pixel;
    a second wiring extending from the second terminal to the second pixel;
    a first wiring substrate including a first coupling region which is in contact with the first terminal; and
    a second wiring substrate including a second coupling region which is in contact with the second terminal,
    wherein a width of the second wiring is larger than a width of the first wiring.

11. The electro-optic apparatus according to claim 10, wherein the first wiring substrate includes a driving circuit.

12. An electronic device comprising the electro-optic apparatus according to claim 10.

* * * * *